United States Patent
Goux et al.

(10) Patent No.: US 8,649,213 B2
(45) Date of Patent: Feb. 11, 2014

(54) MULTIPLE BIT PHASE CHANGE MEMORY CELL

(75) Inventors: Ludovic R. A. Goux, Hannut (BE); Thomas Gille, Heverlee (BE); Judit G. Lisoni, Oud-Heverlee (BE); Dirk J. C. C. M. Wouters, Heverlee (BE)

(73) Assignee: NXP B.V., Eindhoven (NL)

( * ) Notice: Subject to any disclaimer, the term of this patent is extended or adjusted under 35 U.S.C. 154(b) by 228 days.

(21) Appl. No.: 12/935,656

(22) PCT Filed: Mar. 30, 2009

(86) PCT No.: PCT/IB2009/051327
§ 371 (c)(1),
(2), (4) Date: May 2, 2011

(87) PCT Pub. No.: WO2009/122347
PCT Pub. Date: Oct. 8, 2009

(65) Prior Publication Data
US 2012/0069645 A1 Mar. 22, 2012

(30) Foreign Application Priority Data
Apr. 1, 2008 (EP) .................................... 08103304

(51) Int. Cl.
*G11C 11/00* (2006.01)
(52) U.S. Cl.
USPC ............... 365/163; 365/164; 365/148; 257/4; 257/2; 257/3
(58) Field of Classification Search
USPC ................ 365/163, 164, 148; 257/4, 2, 3
See application file for complete search history.

(56) References Cited

U.S. PATENT DOCUMENTS

| 7,042,001 B2 | 5/2006 | Kim et al. |
| 7,728,319 B2 | 6/2010 | Goux et al. |
| 2005/0112896 A1 | 5/2005 | Hamann et al. |
| 2006/0226411 A1 | 10/2006 | Lee |
| 2006/0249725 A1 | 11/2006 | Lee |
| 2007/0097739 A1 | 5/2007 | Happ |
| 2008/0017894 A1 | 1/2008 | Happ et al. |
| 2008/0019170 A1 | 1/2008 | Happ et al. |
| 2008/0019257 A1 | 1/2008 | Philipp et al. |
| 2008/0105861 A1 | 5/2008 | Hosaka et al. |

FOREIGN PATENT DOCUMENTS

| CN | 101110465 A | 1/2008 |
| CN | 101110466 A | 1/2008 |
| CN | 101110467 A | 1/2008 |
| CN | 101267016 A | 9/2008 |

(Continued)

OTHER PUBLICATIONS

Bolivar, P. Haring, et al; "Laterial Design for Phase Change Random Access Memory Cells With Low Current Consumption"; EPCOS-2004 Conference; 4 Pages (2004).

(Continued)

*Primary Examiner* — Connie Yoha

(57) ABSTRACT

A phase change memory cell has more than one memory region each being a narrowed region of phase change memory material extending between first and second electrodes. Each of the plurality of memory regions can be programmed to be in a low resistance state or a high resistance state by applying suitable programming conditions of current and/or voltage. The resistances of the high resistance states and the programming conditions to convert the high resistance states to the low resistance state are different in each of the plurality of memory regions.

13 Claims, 3 Drawing Sheets

(56) References Cited

FOREIGN PATENT DOCUMENTS

Figure 1:
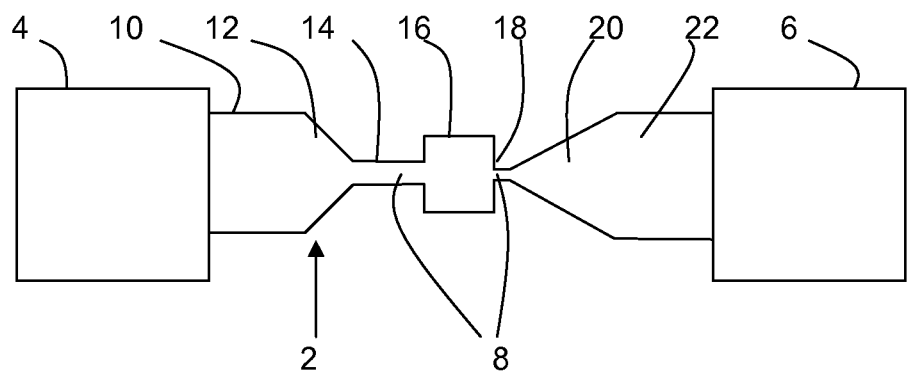

| | | |
|---|---|---|
| EP | 1710840 A2 | 11/2006 |
| EP | 1881539 A2 | 1/2008 |
| EP | 1881540 A2 | 1/2008 |
| EP | 1881541 A2 | 1/2008 |
| EP | 1886317 B1 | 1/2009 |
| JP | 2008091682 A | 4/2008 |
| JP | 2008103676 A | 5/2008 |
| JP | 2008103677 A | 5/2008 |
| WO | 2006123305 A1 | 11/2006 |
| WO | 2006123306 A1 | 11/2006 |
| WO | 2007072308 A1 | 6/2007 |

OTHER PUBLICATIONS

Lankhourst, M.H.R., et al; "Low-Cost and Nanoscale Non-Volatile Memory Concept for Future Silicon Chips"; Nature Materials; (Mar. 13, 2005).

International Seach Report and Written Opinion for Application PCT/IB2009/051327 (Mar. 30, 2009).

"Research on Sulfide and Devices of Phase Change Memory", Ling Yun, A Collection of Thesis in China, Aug. 15, 2007.

English translation of: Office Action issued in Chinese Patent Application No. 200980111512.2, State Intellectual Property Office of People's Republic of China, Apr. 1, 2013.

MULTIPLE BIT PHASE CHANGE MEMORY CELL

The invention relates to a phase change memory cell with multiple bits, and methods for storing data in such a cell.

Phase change memory cells involve a phase change material that changes state, generally between a low and a high resistance state. Frequently, chalcogenide materials are used. Such materials can have a low resistance in a crystalline state and a high resistance in an amorphous state. Applying a suitable current in the low resistance crystalline state causes sufficient heating to change the state to the high resistance amorphous state, known as a reset. Applying a suitable lower voltage to the high resistance amorphous state changes the material back to the low resistance crystalline state.

Thus, the cells can be used as memory cells each storing one bit, represented by the low or high resistance state. The changes in state are reversible allowing the memory to be erased and reprogrammed as required.

Phase change memory cells can be implemented in a vertical format as explained in more detail in WO2007/0732308 (Philips/IMEC) which also discloses suitable manufacturing methods.

A lateral format is also possible as shown in WO2006/123306 (Philips/IMEC).

According to the invention, there is provided a multiple bit phase change memory cell according to claim 1.

By providing a plurality of memory regions more than one bit per cell and hence increased data storage can be obtained.

This can be achieved be arranging for the memory regions to have different properties. In particular, the memory regions may have different resistances so that the state of all of the memory regions can be determined simply by measuring the resistance between the electrodes. The memory regions also need to be separately programmable and this may be achieved by ensuring that the reset currents needed to change the state of each region to a high resistance state and the set voltage needed to change the state of each region to a low resistance state varies between the elements.

Each memory region may be a memory region surrounded by a region of greater width than the memory region, i.e. the memory region may be of reduced width. Such memory regions may also be referred to as constrictions.

The phase change memory material may have different geometries in each of the different memory regions to achieve the different resistances and programming conditions.

In another aspect, the invention also relates to a method of operation of such a phase change memory cell.

Figure 2:
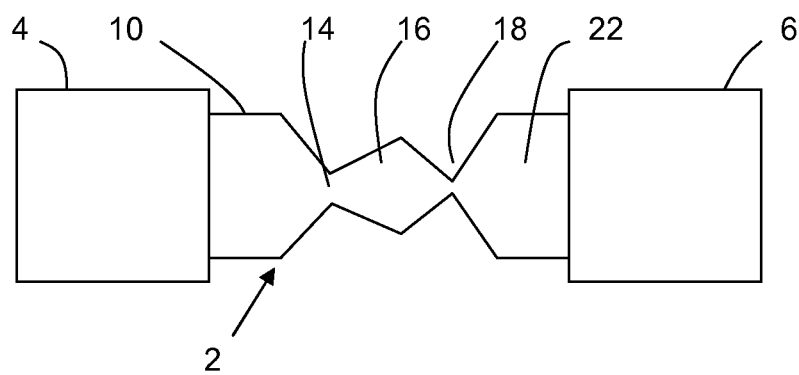
Figure 3:
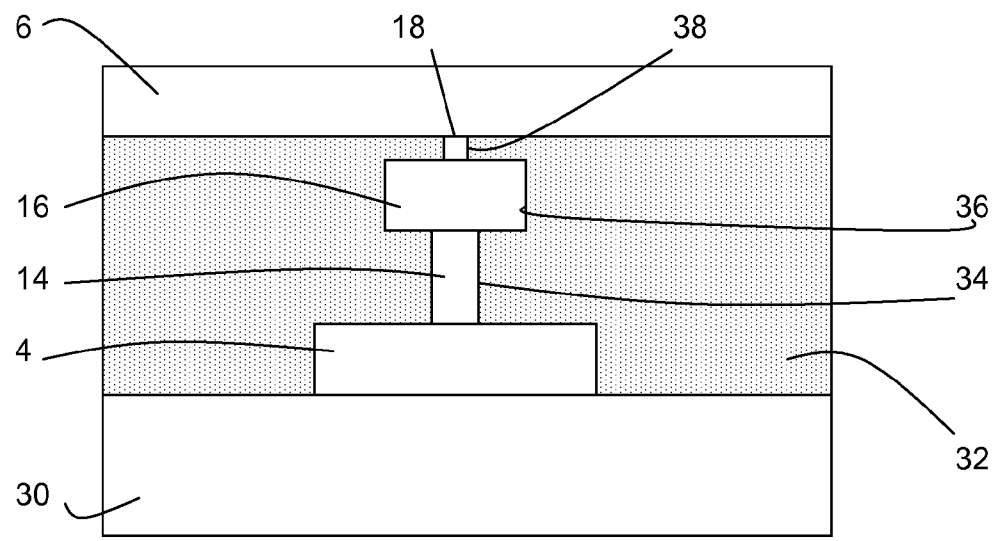
Figure 4:
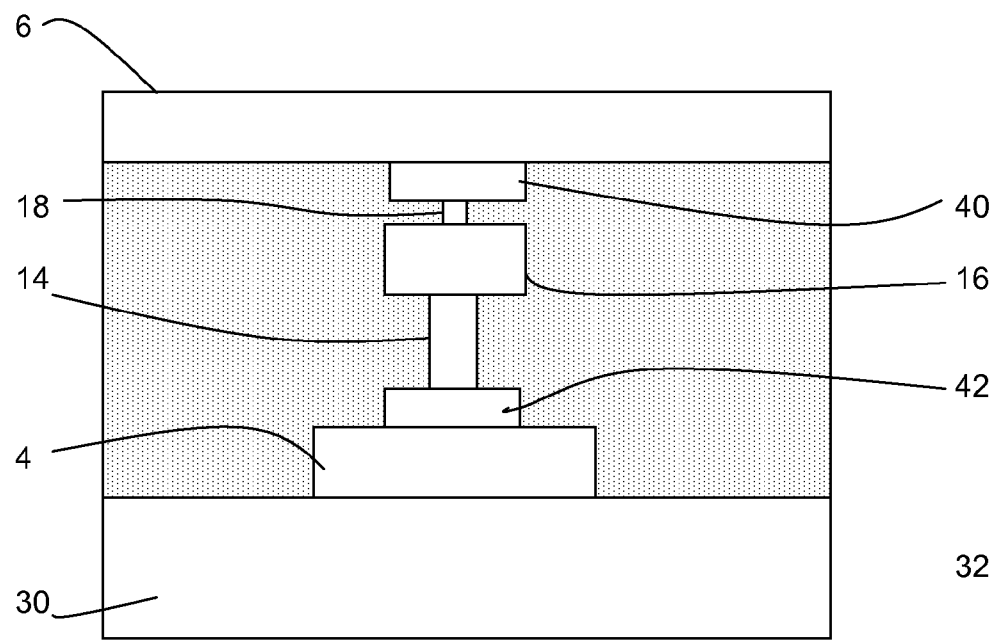
Figure 5:
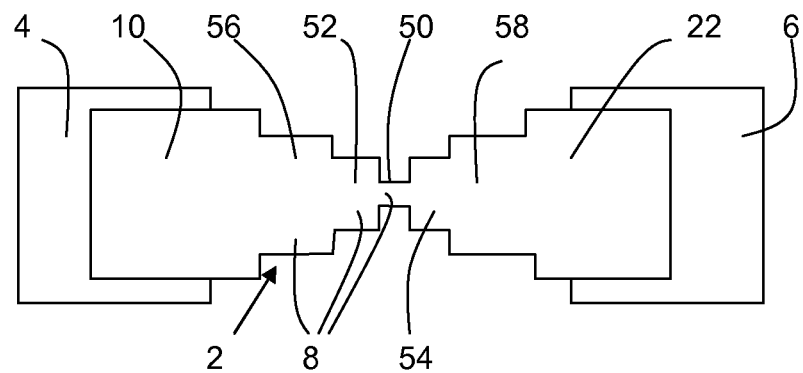
Figure 6:
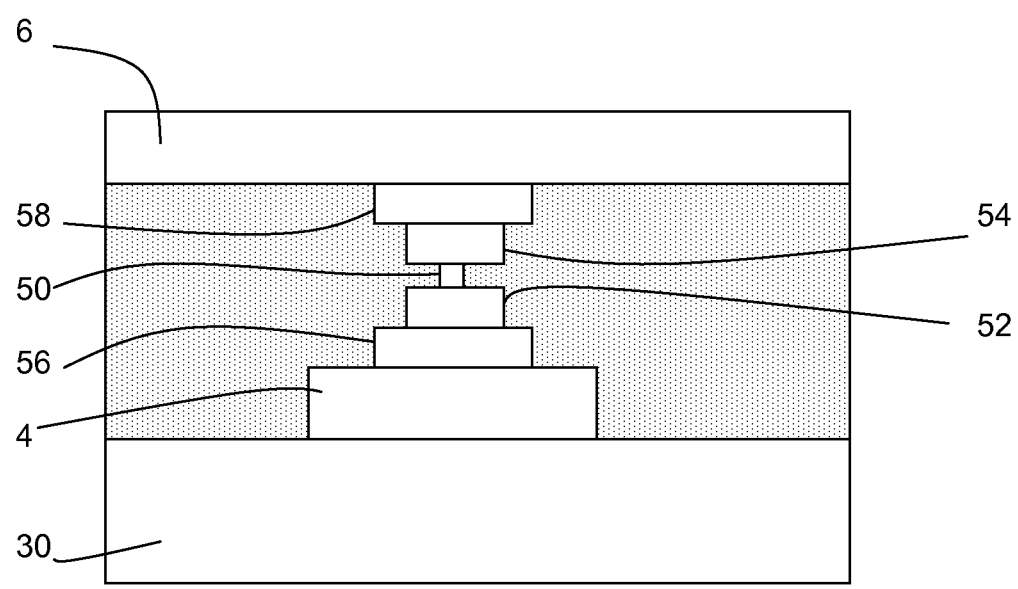

Embodiments of the invention will now be described, purely by way of example, with reference to the accompanying drawings, in which:

FIG. 1 is a top view of a first embodiment of the invention;
FIG. 2 is a top view of a second embodiment of the invention;
FIG. 3 is a side view of a third embodiment of the invention;
FIG. 4 is a side view of a fourth embodiment of the invention;
FIG. 5 is a top view of a fifth embodiment of the invention; and
FIG. 6 is a side view of a sixth embodiment of the invention.

The figures are schematic and not to scale. Like or similar components are given the same reference numerals in the figures.

Referring to FIG. 1, a first embodiment relates to a lateral two-bit phase change memory cell. A phase change memory material 2 extends laterally between a first electrode 4 and a second electrode 6 with a number of memory regions 8. Note that the electrodes 4, 6 are in the embodiment above the phase change memory material 2 to allow contacting to the electrodes.

Starting from the first electrode 4, the phase change memory material has firstly a first flap 10 of constant width, followed by a first tapered region 12 decreasing in width to a first constriction 14 having a constant width W1 and length L1. This is followed by an intermediate region 16 of width W2 and length L2, and a second constriction 18 of length L3 and width L3. A second tapered region 20 then expands the width to join to second flap 22 which is in turn connected to the second electrode. The first and second constrictions 14, 18 are the first and second memory regions 8. Thus, in this embodiment, the first and second memory regions are arranged in series.

The widths and lengths, especially of the first and second constrictions 14, 18, are selected to allow independent writing to the first and second memory regions 8 and also to allow them to be independently read.

In the particular example, L3=W3 so that the second constriction is square, W3<W1 to achieve a higher current density in the second constriction 18 compared with the first constriction 14. This ensures that the current required to reset the second constriction to the high resistance state is less than the current required to reset the first constriction to the high resistance state.

Further, L1 is approximately twice W1 so that the resistance of the first constriction 14 is approximately double that of the second constriction 18.

For a better understanding, a particular example will be given; it will be appreciated that this example is an example only and values of currents, resistance and voltage can change depending on the materials used and other factors.

The phase change memory material 2 in this example is a chalcogenide glass that can be converted from a crystalline state to an amorphous state by the application of current and back again by the application of voltage.

Initially, consider the case that both the first and second constrictions 14, 18 are crystalline with a low resistance. In this state, the resistance between first and second electrodes 4, 6 is approximately 1 kΩ.

A current of approximately 0.5 mA is passed between the first and second electrodes 4, 6. This creates a greater current density in the second constriction 18 which is sufficient to convert it to an amorphous state, while the lower current density in the first constriction 14 leaves the first constriction in the low resistance crystalline state. With the second constriction 18 in the amorphous state, the resistivity of the second constriction 18 is about 500 kΩ per square and since the length is approximately the width the resistance between electrodes 4, 6 is dominated by the second constriction and approximately 500 kΩ.

Instead of using a 0.5 mA current, a higher current of approximately 1 mA is sufficient to generate enough current density in both the first and second constrictions to turn both of them into the high resistivity anorphous state. In this state, the first constriction (which has a length approximately twice the width) has a resistance of approximately 1 MΩ, so the total resistance between electrodes 4,6 is approximately 1.5 MΩ.

Conventionally, such conversion to an amorphous state is known as resetting and the currents applied are known as reset currents.

To set the second constriction alone, i.e. to convert that back to a low resistance state, a set voltage of about 0.3 V can be applied across the electrodes 4,6. Although the resistance is higher in the first constriction 14, the length of the second constriction 18 is only approximately one quarter the length of the first constriction 14 and so the electric field applied is double in the second constriction 18 compared with the first constriction 14. This voltage is sufficient to render the second constriction crystalline (i.e. conducting) leaving just the high resistance of the first constriction, namely about 1 MΩ.

Instead, a higher voltage of 0.8V can be applied. This is sufficient to convert both the first and second constrictions 14, 18 to the crystalline state and hence return to the low resistance state with about 1 kΩ.

It will be seen that in the example the resistance can be 1 kΩ, 500 kΩ, 1 MΩ or 1.5 MΩ, and accordingly a single resistance measurement unambiguously confirms the state of both of the constrictions 14, 18.

Thus, this memory cell is a two bit cell where both of the bits can be read independently using a single resistance measurement.

In other words, each constriction, i.e. each memory region, can be separately controlled to be in a fully amorphous or a fully crystalline state, that is to say each memory region stores a bit.

Those skilled in the art will realise that the sizes, ratios and materials can be adjusted from the above example. However, these should be chosen so that a single resistance measurement confirms the state of both memory elements by ensuring that the high resistance state of each of the memory elements is different.

Further, note that the electrodes 4, 6 are in the embodiment above the phase change memory material 2 to allow contacting to the electrodes. In an alternative embodiment the electrodes may also be below the phase change memory material, with the PCM flaps overlapping only partially and leaving space for making top contacts.

An alternative programming approach uses different programming times to program the different regions. For example, in the above embodiment, applying 0.8V for a very short time may also be used to set only one region. When a voltage of 0.8V is applied, the first constriction 14 and the second constriction 18 will start to crystallize. Because the current density is higher in the second constriction 18, it will have a higher crystallization rate than the first constriction 14. As a consequence, the second constriction crystallizes before the first constriction 14. By interrupting the set pulse at the right time, only the second constriction is rendered crystalline leaving just the high resistance of the first constriction, namely about 1 MΩ. A longer voltage pulse of 0.8V can be applied to crystallize both constrictions.

The tapered regions 12, 20 can be differently formed, omitted, or replaced by non-tapered regions. To allow programming of multiple memory elements using only the two electrodes 4, 6 both the reset current required to reset each constriction should be different as well as the set voltage required to set each constriction. In this way, the memory elements can be independently programmed.

If required, a particular state can be achieved by setting one or more memory elements and then resetting one or more elements to achieve the desired state. In the example above, starting from the state where both memory elements are in the low resistance state, to achieve the state where just the first memory element is in the high resistance state this can be achieved by applying a high reset current to bring both of the memory elements into the high resistance state and then applying a moderate set voltage (0.3V in the example above) to bring just the second memory element 18 into the low resistance state to achieve the desired state of both memory element.

Note that the number of memory elements is not limited to two and those skilled in the art will readily realise how to implement the invention with three or more memory regions, for example arranged as three or more regions arranged in series. Suitable geometries can be selected to allow each of the memory elements to have different resistances, reset programming currents and set voltages.

Turning to FIG. 2, this shows a second example which does not have memory elements of rectangular or square shape but instead uses tapered constrictions, of different width.

The geometries of the constrictions are different leading to a similar approach to programming as in the first example.

FIG. 3 illustrates an alternative to the lateral structures shown in FIGS. 1 and 2. In particular, FIG. 3 shows a vertical structure.

A bottom electrode 4, first constriction 14, intermediate region 16, second constriction 18 and top electrode 6 are provided in vias 34,36,38 in a dielectric 32 on substrate 30. Each of the constrictions 14, 18 and intermediate region 16 may be formed of a phase change material. The constrictions function as memory regions 8.

Such structures can be manufactured by a damascene process as follows.

Firstly, the bottom electrode 4 is fabricated.

Dielectric 32 is then deposited, and a first via 34 formed stopping on the bottom electrode. The first via is then filled with phase change memory material 2 to form first constriction 14 in a single damascene process.

A second layer of dielectric is formed, a second via 36 formed in the dielectric and filled with phase change material to form intermediate region 16 in a second single damascene process.

A third layer of dielectric is formed, third via 38 opened and filled with phase change material to form second constriction 18 in a third single damascene process.

The top electrode is then deposited and patterned.

The damascene processes each deposit the phase change material over the surface and etch back, for example using chemical mechanical polishing (CMP) so that the phase change material is removed from the surface remaining in the respective via.

In this case, the via height and area are the relevant parameters that are adjusted to ensure different properties for each of the constrictions.

Alternatively, instead of a purely geometric approach to ensuring different properties, the via fill materials may be of different materials.

Alternatively, differing materials may be provided to deliver certain benefits. For example the constrictions 14, 18 may be formed of a material such as Ge2Sb2Te5 which is relatively high resistance, thus dissipating more heat making it easier to program, whereas the intermediate region 16 may be made of a lower resistance material such as SbTe.

Confinement parts 40, 42 can be included as illustrated in the alternative embodiment shown in FIG. 4. The confinement parts 40,42 have a lower heat capacity or heat conductivity compared with the electrodes 4, 6 and so they reduce the heat sinking effect of the top and bottom electrodes 4,6 which otherwise reduce the heating effect of the current. In this way, a smaller current can be used to reset the memory elements into the high resistance state so this approach can improve performance.

The number of memory elements can be varied and is not limited to two. FIG. 5 illustrates an approach with three constrictions, a first central constriction 50, a second constriction acting as a memory region made up from two regions 52, 54 one on either side of the first constriction 50, and a third constriction acting as a memory region made up from two regions 56, 58 one on either side of the second constriction 52, 54 between flaps 10,22.

In use, a first state corresponds to rendering just the first constriction 50 amorphous, in a second state the first constriction 50 and second constriction 52, 54 is rendered amorphous and in a third state all three constrictions are rendered amorphous.

In this case, the second constriction 52, 54 surrounds the first constriction and the third constriction 56, 58 surrounds the second constriction; each of the constrictions thus constitutes the wider region for the previous constriction.

FIG. 6 illustrates a vertical implementation of the same idea. Again, a central first constriction 50 is surrounded by a second constriction 52,54 and a third constriction 56,58.

Those skilled in the art will realise that there are many possible variations to the above. For example, the materials used can be varied.

Further, the shape of the via in the above embodiments is circular but other shapes, such as square, rectangular, or indeed any other shape can also be used.

Although the method described to manufacture vertical structures is a single layer damascene process, dual damascene processes can also be used, for example to manufacture the intermediate region 16 and lower constriction 14 in a single dual damascene step.

It will further be appreciated that any specific current, voltage and resistance values are purely by way of example.

Furthermore, although the memory regions shown are formed as constrictions, i.e. narrower regions between wider regions, this is not essential and any suitable form of memory region can be adopted as required. For example, memory regions of can be provided between regions of different material, the regions of different material being of the same width as the memory material.

The invention claimed is:

1. A phase change memory cell, comprising:
   a phase change memory material extending between first and second electrodes; and
   a plurality of memory regions in the phase change memory material between the first and second electrodes,
   wherein each of the plurality of memory regions are programmable in a low resistance state or a high resistance state by applying programming conditions of current and voltage; and
   each of the plurality of memory regions respectively having different resistances of the high resistance states and different programming conditions to convert between the high resistance state and the low resistance state.

2. The phase change memory cell according to claim 1 wherein:
   each memory region is surrounded by a region of greater width than the memory region;
   each of the memory regions can be converted from a crystalline low resistance state to an amorphous high resistance state by a respective reset current and can be converted from the amorphous high resistance state to the crystalline low resistance state by a respective set voltage; and
   the geometry of each of the memory regions is different such that the resistances of each of the memory regions in the high resistance state is different, the respective reset currents are different and the respective set voltages are different.

3. The phase change memory cell according to claim 1 wherein each memory region has a constant width and a constant length, and wherein a respective aspect ratio of length over width and the respective width are both different for each of the plurality of memory regions.

4. The phase change memory cell according to claim 1 wherein each memory region is tapered and each has a different minimum width.

5. The phase change memory cell according to claim 1 wherein the phase change memory material extends laterally across a substrate between the first and second electrodes.

6. The phase change memory cell according to claim 1 wherein the first and second electrodes are bottom and top electrodes, and the phase change memory material is filled in a plurality of vias of different width defining the memory regions and extending between the top and bottom electrodes, the via being surrounded by insulating material.

7. The phase change memory cell according to claim 1 comprising at least one intermediate region between the memory regions, wherein the at least one intermediate region is made of a material of lower resistivity than the memory regions.

8. A method of operation of a phase change memory cell extending between first and second electrodes having a plurality of memory regions in the phase change memory cell between the first and second electrodes, each of the plurality of memory regions being programmable to be in a low resistance state or a high resistance state by applying suitable programming conditions of current and/or voltage, the resistances of the high resistance states and the programming conditions to convert between the high resistance states and the low resistance state being different in each of the plurality of memory regions,
   the method comprising:
   measuring the resistance between the first and second electrodes; and
   determining which of the memory regions are in the high resistance state and which in the low resistance state from the measured resistance.

9. The method of operation of the phase change memory cell according to claim 8 further comprising:
   selecting a reset current to change a selected one or more of the memory regions to the high resistance state;
   applying the reset current between the electrodes to change the selected memory regions to the high resistance state.

10. The method of operation of the phase change memory cell according to claim 8 further comprising:
    selecting a set current to change a selected one or more of the memory regions to the low resistance state;
    applying the set current between the electrodes to change the selected memory regions to the low resistance state.

11. The method of operation of the phase change memory cell according to claim 9 further comprising:
    selecting a set current to change a selected one or more of the memory regions to the low resistance state;
    applying the set current between the electrodes to change the selected memory regions to the low resistance state.

12. An apparatus comprising:
    a plurality of phase change memory cells including
    a phase change memory material extending between first and second electrodes, and
    a plurality of memory regions provided in the phase change memory material, each of the plurality of memory regions being programmable in a low resistance state or a high resistance state by applying programming conditions of current or voltage and each having different resistances, whereby a memory region may be programmed to convert between the high resistance state and the low resistance state, independent of the other memory regions in the phase change memory cell; and a device configured and arranged to program and read the plurality of phase change memory cells, and the plurality of memory regions within the plurality of phase change memory cells, by measuring the resistance between the first and second electrodes of the phase change memory cell and to determine a resistance state of each of the plurality of memory regions.

13. The apparatus according to claim 12, wherein a memory region of the plurality of memory regions has said phase change resistance that is a function of the phase change memory material, the physical shape, and dimensions of said memory region.

* * * * *